United States Patent
Utsumi et al.

(10) Patent No.: US 10,790,373 B2
(45) Date of Patent: Sep. 29, 2020

(54) SEMICONDUCTOR DEVICE AND METHOD OF MANUFACTURING SAME

(71) Applicant: Fuji Electric Co., Ltd., Kanagawa (JP)

(72) Inventors: Makoto Utsumi, Nagano (JP); Yoshiyuki Sakai, Nagano (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 1 day.

(21) Appl. No.: 16/123,216

(22) Filed: Sep. 6, 2018

(65) Prior Publication Data
US 2019/0115439 A1 Apr. 18, 2019

(30) Foreign Application Priority Data
Oct. 17, 2017 (JP) ................. 2017-200997

(51) Int. Cl.
| H01L 29/45 | (2006.01) |
| H01L 21/8234 | (2006.01) |
| H01L 29/423 | (2006.01) |
| H01L 29/51 | (2006.01) |
| H01L 29/739 | (2006.01) |
| H01L 29/78 | (2006.01) |
| H01L 29/417 | (2006.01) |
| H01L 29/40 | (2006.01) |
| H01L 29/66 | (2006.01) |
| H01L 29/745 | (2006.01) |

(52) U.S. Cl.
CPC ...... *H01L 29/45* (2013.01); *H01L 21/823443* (2013.01); *H01L 29/401* (2013.01); *H01L 29/417* (2013.01); *H01L 29/4236* (2013.01); *H01L 29/456* (2013.01); *H01L 29/51* (2013.01); *H01L 29/66348* (2013.01); *H01L 29/7397* (2013.01); *H01L 29/7813* (2013.01); *H01L 29/7396* (2013.01); *H01L 29/7455* (2013.01)

(58) Field of Classification Search
CPC ...................................... H01L 29/45
See application file for complete search history.

(56) References Cited

U.S. PATENT DOCUMENTS

2017/0194438 A1* 7/2017 Kumagai ............ H01L 29/0865
2017/0309574 A1 10/2017 Yamada et al.

FOREIGN PATENT DOCUMENTS

| JP | 2013-232557 A | 11/2013 |
| JP | 2016-86064 A | 5/2016 |

* cited by examiner

*Primary Examiner* — Wael M Fahmy
*Assistant Examiner* — Sarah K Salerno
(74) *Attorney, Agent, or Firm* — Chen Yoshimura LLP

(57) ABSTRACT

A semiconductor device includes a first barrier film covering the main surface of the active region and the insulating film layer, the first barrier film having an ohmic contact hole that exposes a contact portion of the ohmic contact formation region within the window of the insulating film layer; a base contact layer filled into the ohmic contact hole and making ohmic contact with the contact portion of the ohmic contact formation region; a second barrier film made of titanium, covering the base contact layer and the first barrier film; and a third barrier film made of titanium oxide and titanium nitride, covering a surface of the second barrier film.

12 Claims, 9 Drawing Sheets

SEMICONDUCTOR DEVICE AND METHOD OF MANUFACTURING SAME

BACKGROUND OF THE INVENTION

Technical Field

The present invention relates to an electrode structure of a semiconductor device and a method of manufacturing the same.

Background Art

The main electrode region, such as the source region or drain region, provided in the active region of a semiconductor device is electrically connected to an ohmic electrode. In this case, an insulating film layer such as an interlayer insulating film is selectively disposed between the ohmic electrode and the active region, and ohmic contact is made at a window part provided in the insulating film layer. If the metal or hydrogen contained in the ohmic electrode in this type of structure diffuses to the insulating film layer and the active region, then the electric boundary conditions of the semiconductor device will fluctuate, and electrical characteristics such as the threshold voltage will fluctuate.

Patent Document 1 proposes a method for reducing threshold fluctuations by using, for an interlayer insulating film, a silicon oxide film (NSG) to which impurities have not been added and a silicon oxide film (BPSG) to which boron and phosphorous have been added. Patent Document 1 also discloses using a titanium nitride (TiN) barrier layer between a source electrode containing aluminum (Al) and an interlayer insulating film. Patent Document 2 discloses using a metal such as titanium (Ti) for an ohmic electrode and forming TiN via a heat treatment in a nitrogen ($N_2$) atmosphere.

However, the diffusion paths through which the metal or hydrogen etc. contained in the ohmic electrode affect the threshold is broadly categorized into the two systems below. The first path goes from the ohmic electrode, through the interlayer insulating film, and reaches the gate insulating film. The second path goes from the ohmic electrode, through the semiconductor layer, and reaches the channel section. In Patent Documents 1 and 2, the arrangement position of the barrier layer is insufficient when taking into consideration the aforementioned diffusion paths.

RELATED ART DOCUMENTS

Patent Documents

Patent Document 1: Japanese Patent Application Laid-Open Publication No. 2016-86064
Patent Document 2: Japanese Patent Application Laid-Open Publication No. 2013-232557

SUMMARY OF THE INVENTION

The present invention, in view of the aforementioned problem, aims at providing a semiconductor device with stable electrical characteristics and high reliability by preventing the diffusion of metal or hydrogen atoms etc. contained in an ohmic electrode and suppressing fluctuations in electric boundary conditions, and a method of manufacturing the same.

Additional or separate features and advantages of the invention will be set forth in the descriptions that follow and in part will be apparent from the description, or may be learned by practice of the invention. The objectives and other advantages of the invention will be realized and attained by the structure particularly pointed out in the written description and claims thereof as well as the appended drawings.

To achieve these and other advantages and in accordance with the purpose of the present invention, as embodied and broadly described, in one aspect, the present disclosure provides a semiconductor device, including: (a) an active region made of semiconductor containing silicon, the active region including a carrier traveling region and an ohmic contact formation region having a higher impurity concentration than the carrier traveling region; (b) an insulating film layer selectively disposed on a main surface of the active region, the insulting film layer having a window that exposes a portion of the ohmic contact formation region; (c) a first barrier film covering the main surface of the active region and the insulating film layer, the first barrier film having an ohmic contact hole that exposes a contact portion of the ohmic contact formation region within the window of the insulating film layer; (d) a base contact layer filled into the ohmic contact hole and making ohmic contact with the contact portion of the ohmic contact formation region; (e) a second barrier film made of titanium, covering the base contact layer and the first barrier film; (f) a third barrier film made of titanium oxide and titanium nitride, covering a surface of the second barrier film; and (g) a surface electrode layer disposed on the third barrier film.

In another aspect, the present disclosure provides a method of manufacturing a semiconductor device, the method including: (a) forming, in an active region made of semiconductor containing silicon, a carrier traveling region and an ohmic contact formation region having a higher impurity concentration than the carrier traveling region; (b) forming an insulating film layer on a main surface of the active region, the insulting film layer having a window that exposes a portion of the ohmic contact formation region; (c) forming a first barrier film covering the main surface of the active region and the insulating film layer, the first barrier film having an ohmic contact hole that exposes a contact portion of the ohmic contact formation region within the window of the insulating film layer; (d) filling a base contact layer into the ohmic contact hole so as to make ohmic contact with the contact portion of the ohmic contact formation region; (e) forming a second barrier film by depositing a titanium layer covering the base contact layer and the first barrier film; (f) forming a titanium nitride film covering the second barrier film; (g) causing the titanium nitride film to react with oxygen so as to contain titanium oxide in a portion of the titanium nitride film, thereby forming a third barrier film made of titanium oxide and titanium nitride; and (h) forming a surface electrode layer on the third barrier film.

The present invention makes it possible to prevent the diffusion of metal or hydrogen atoms etc. contained in an ohmic electrode and to suppress fluctuations in electric boundary conditions, thereby making it possible to provide a semiconductor device that suppresses fluctuations in electric boundary conditions and has stable electrical characteristics and high reliability, and a method of manufacturing the same.

It is to be understood that both the foregoing general description and the following detailed description are exemplary and explanatory, and are intended to provide further explanation of the invention as claimed.

DETAILED DESCRIPTION OF EMBODIMENTS

Figure 1:
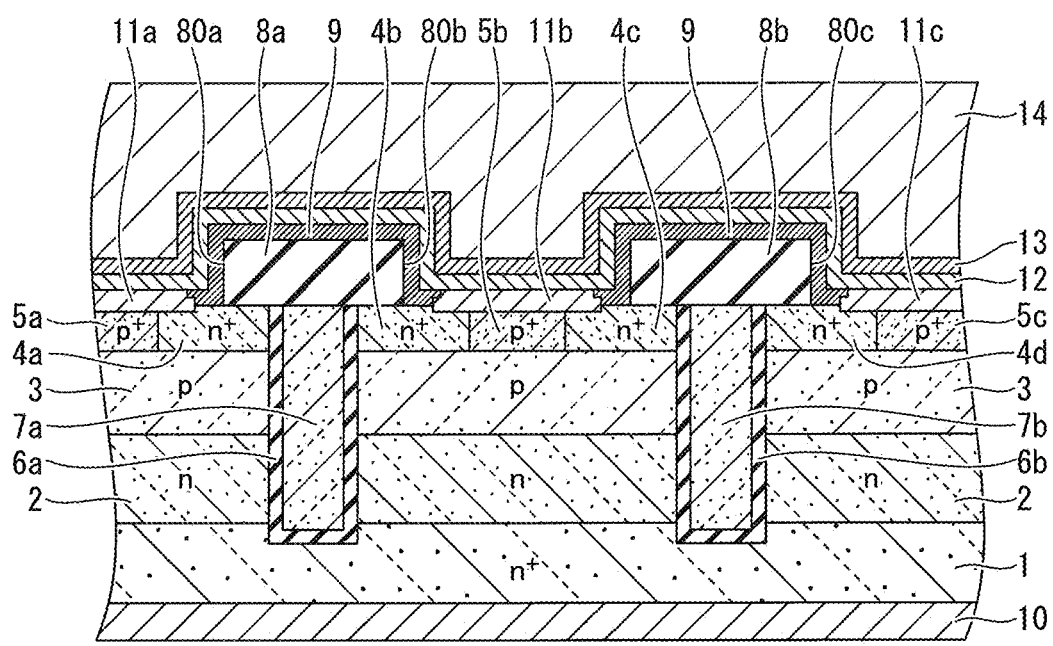
FIG. 1 is a cross-sectional view of main components showing one example of a semiconductor device according to an embodiment of the present invention.

An embodiment of the present invention will be explained below with reference to the drawings. In the drawings, portions that are the same or similar will be assigned the same or similar reference characters and redundant explanations will be omitted. However, the drawings are schematic, and the relationship between thickness and planar dimensions, the ratio of the thickness of each layer, etc. may differ from practice. Furthermore, there can be parts for which the relationship between dimensions, ratios, etc. differ even among the drawings. The embodiment shown below illustratively indicates a device and method for carrying out the technical idea of the present invention, and the technical idea of the present invention is not limited to the material, shape, structure, arrangement, etc. of the constituent components described below.

In addition, the definition of directions such as up-down in the description below are merely definitions for convenience of explanation and do not limit the technical idea of the present invention. For example, if an object is observed after being rotated 90°, up-down is converted to left-right, and if observed after being rotated 180°, up-down is inversed. Further, in the description below, the first conductivity type is illustratively described as n-type and the second conductivity as p-type. However, an inverse relationship may be selected for the conductivity types, where the first conductivity type is p-type and the second conductivity type is n-type. A "+" or "−" attached to an "n" or "p" signifies that the impurity element concentration of a semiconductor region is higher or lower, respectively, than a semiconductor region not having the "+" or "−". However, this does not mean that semiconductor regions that are both labelled "n" have exactly the same impurity concentrations.

In the description below, "ohmic contact formation region" is a semiconductor region with a high impurity concentration of e.g. $5 \times 10^{17}$ cm$^{-3}$ to $1 \times 10^{21}$ cm$^{-3}$ with which an ohmic electrode makes ohmic contact. In other words, the "ohmic contact formation region" of the present invention is a concept including the main electrode region of various types of semiconductor devices such as switching elements and the base contact region of a MOS transistor, etc. An ordinary three-terminal semiconductor device or the like has two main electrode regions: a main electrode region emitting a main current that flows through a carrier traveling region, and a main electrode region that receives the carriers constituting the main current. One of these can be defined as the "first main electrode region," and the other as the "second main electrode region." In other words, the "first main electrode region" means a semiconductor region serving as either a source region or a drain region in a field effect transistor (FET) or static induction transistor (SIT). In an insulated gate bipolar transistor (IGBT), "first main electrode region" means a semiconductor region serving as either the emitter region or collector region. In a static inductor thyristor (SI thyristor) or gate turn-off thyristor (GTO), "first main electrode region" means a semiconductor region serving as either the anode region or cathode region. The "second main electrode region" means, in an FET or SIT, a semiconductor region serving as whichever of the source region or drain region that is not the first main electrode region. In an IGBT, "second main electrode region" means a region serving as whichever of the emitter region or collector region that is not the first main electrode region. In an SI thyristor or GTO, "second main electrode region" means a region serving as whichever of the anode region or cathode region that is not the first main electrode region. In this manner, if the "first main electrode region" forming at least a portion of the "ohmic contact formation region" of the present invention is the source region, then the "second main electrode region" means the drain region. If the "first main electrode region" is the emitter region, then "second main electrode region" means the collector region. If the "first main electrode region" is the anode region, then "second main electrode region" means the cathode region. If the bias relationship is interchanged, then in many cases, the function of the "first main electrode region" and the function of the "second main electrode region" are interchangeable.

As described below, one of the features of the present invention is preventing the metal etc. contained in an ohmic electrode from diffusing to an interlayer film layer and active region. In other words, one of the features of the present invention is stabilizing electric boundary conditions such as the interface state and the surface potential of the interface between the insulating film layer and active region. Accordingly, the present invention exhibits marked effects in preventing fluctuation or variation of the threshold voltage of an insulated gate transistor such as a MOS transistor. The insulated gate transistor can also be more comprehensively referred to as a "MIS transistor," but MIS transistor includes MISFETs, MISSITs, etc. There are also MIS composite type SI thyristors, and thus the present invention can also be applied to SI thyristors. Furthermore, other effects are also clear when taking into consideration that it is possible to prevent the metal, etc. contained in the ohmic electrode from diffusing through the interlayer film layer and reaching the interface between the interlayer film layer and the semiconductor layer. In other words, it is also possible to prevent leakage current at the interface between the insulating film layer and the semiconductor layer, which serves as the withstand-voltage structure of the periphery of a power semiconductor device. In the description of the embodiment below, as shown in FIG. 1, a MOS transistor with a trench gate structure is illustratively described as a representative example for sake of convenience. However, it shall be obvious to a person skilled in the art, as understood from the spirit of the present invention described below, that similar effects are exhibited even with a planar structure, such as a planar gate MOS transistor.

(Semiconductor Device)

As shown in FIG. 1, the semiconductor device according to the embodiment of the present invention includes an active region (1, 2, 3, 4a to 4d, 5a to 5c), insulating film layers (interlayer insulating films) 8a, 8b, a first barrier film 9, base contact layers 11a, 11b, 11c, a second barrier film 12, and a third barrier film 13. The active region (1, 2, 3, 4a to 4d, 5a to 5c) includes a carrier traveling region (2, 3) and an ohmic contact formation region (4a to 4d, 5a to 5c). The carrier traveling region (2, 3) includes a drift layer 2 of a first conductivity type (n-type) and a base layer 3 of a second conductivity type (p-type). The ohmic contact formation region (4a to 4d, 5a to 5c) is a semiconductor region of a higher impurity concentration than the carrier traveling region (2, 3). The ohmic contact formation region (4a to 4d, 5a to 5c) includes $n^+$ first main electrode regions (source regions) 4a, 4b, 4c, 4d, and $p^+$ base contact regions 5a, 5b, 5c. The lower surface of the ohmic contact formation region (4a to 4d, 5a to 5c) is provided with a second main electrode region (drain region) 1. FIG. 1 shows two trenches going through the base layer 3 and the drift layer 2, but in practice there may be a large number of trenches so as to form a multichannel structure. The inner wall of the trench on the left side in FIG. 1 is provided with a gate insulating film 6a, and a gate electrode 7a is disposed on the gate insulating film 6a so as to fill in the trench. Similarly, the inner wall of the trench on the right side of FIG. 1 is provided with a gate insulating film 6b, and a gate electrode 7b is disposed on the gate insulating film 6b so as to fill in the trench.

As shown in FIG. 1, the semiconductor device according to the embodiment of the present invention has an insulating film layer 8a disposed on the gate electrode 7a on the left side, and an insulating film layer 8b disposed on the gate electrode 7b on the right side. The insulating film layer 8a and the insulating film layer 8b may be the same insulating film layer connecting in the depth of the sheet of FIG. 1. In other words, the insulating film layers 8a, 8b are selectively disposed so as to expose a portion of the ohmic contact formation region (4a to 4d, 5a to 5c), and a window part (a window) is provided in the insulating film layers 8a, 8b. The window part provided in the insulating film layers 8a, 8b also includes a gate electrode contact hole for the gate electrodes 7a, 7b, but a description of the structure of the ohmic electrode for the gate electrodes 7a, 7b is omitted. With respect to the contact holes for the source regions 4a, 4b, both sides of the insulating film layer 8a cover a portion of the upper surface of the source regions 4a, 4b, and both sides of the insulating film layer 8b cover a portion of the upper surface of the source regions 4c, 4d. The upper surfaces of the source regions 4a to 4d form the main surface of the active region (1, 2, 3, 4a to 4d, 5a to 5c).

As shown in FIG. 1, in the semiconductor device according to the embodiment of the present invention, a three-layer structure made of a first barrier film 9, second barrier film 12, and third barrier film 13 is provided on the insulating film layer 8a on the left side. Similarly, a three-layer structure made of a first barrier film 9, second barrier film 12, and third barrier film 13 is provided on the insulating film layer 8b on the right side. In a portion on the inner side of the left window part provided in the insulating film layers 8a, 8b, an ohmic opening part (ohmic contact hole) that exposes the source region 4a and base contact region 5a is provided going through the first barrier film 9. In a portion on the inner side of the center window part provided in the insulating film layers 8a, 8b, an ohmic opening part (ohmic contact hole) that exposes the source regions 4b, 4c and base contact region 5b is provided going through the first barrier film 9. In a portion on the inner side of the right window part provided in the insulating film layers 8a, 8b, an ohmic opening part (ohmic contact hole) that exposes the source region 4d and base contact region 5c is provided going through the first barrier film 9. The ohmic opening part on the left side is filled in with the base contact layer 11a, which makes ohmic contact with the source region 4a and base contact region 5a. The ohmic opening part in the center is filled in with the base contact layer 11b, which makes ohmic contact with the source regions 4b, 4c, and the base contact region 5b. The ohmic opening part on the right side is filled in with the base contact layer 11c, which makes ohmic contact with the source region 4d and base contact region 5c. In the semiconductor device according to the embodiment of the present invention, the base contact layers 11a, 11b, and 11c are formed of Ni silicide, but the present invention is not limited to Ni silicide as long as a low contact resistance can be achieved. As shown in FIG. 1, when using Ni silicide, the lower surface of the base contact layers 11a, 11b, 11c is lower than the position of the main surface of the active region (1, 2, 3, 4a to 4d, 5a to 5c). Furthermore, at the interfaces where the base contact layers 11a, 11b, 11c contact the first barrier film 9, the Ni silicide eats into the bottom side of the first barrier film 9.

As shown in FIG. 1, the first barrier film 9 covers the insulating film layers 8a, 8b and the main surface of the active region (1, 2, 3, 4a to 4d, 5a to 5c) at locations other than the ohmic opening parts. The first barrier film 9 can be formed of 10 nm to 150 nm titanium nitride (TiN), for example. The first barrier film 9 is preferably 50 nm to 150 nm titanium nitride. The surface of the base contact layers 11a, 11b, 11c, and the first barrier film 9 are covered by the second barrier film 12. The second barrier film 12 can be made of 10 nm to 100 nm titanium (Ti), for example. The second barrier film 12 is preferably 10 nm to 50 nm. The surface of the second barrier film 12 is covered by the third barrier film 13. In the semiconductor device according to the embodiment of the present invention, the third barrier film 13 is characterized by containing titanium oxide ($TiO_x$) and titanium nitride (TiN). It is preferable that titanium oxide contained in the third barrier film 13 have at least one molecular layer formed on TiN, due to this improving barrier characteristics for preventing diffusion of metal atoms such as Al or hydrogen atoms etc. contained in a surface electrode layer 14. However, the titanium oxide layer need not necessarily exist in a dense state, and as long as the produced titanium oxide can reduce the spaces between grain boundaries in the TiN film, even a sparse distribution state of the titanium oxide layer could prevent the diffusion of metal atoms or hydrogen atoms etc. contained in the surface electrode layer 14 to a certain degree. The thickness of the third barrier film 13 can be 10 nm to 150 nm, for example. The third barrier film 13 is preferably 50 nm to 150 nm. The surface electrode layer 14 is disposed on the third barrier film 13 as an electrode pad. The surface electrode layer 14 can be made of aluminum (Al) or an Al alloy such as Al—Si, Al—Cu—Si, etc.

The insulating film layers 8a, 8b shown in FIG. 1 can be silicon oxide films ($SiO_2$ films) referred to as so-called "NSG" that do not contain phosphorous (P) or boron (B). However, the insulating film layers 8a, 8b may be a silicon oxide film (PSG) to which phosphorous has been added, a silicon oxide film (BSG) to which boron has been added, a silicon oxide film (BPSG) to which boron and phosphorous have been added, a silicon nitride ($Si_3N_4$) film, etc. Furthermore, the insulating film layers 8a, 8b can be a composite film in which a plurality of types of films have been selected and combined among the NSG film, PSG film, BSG film, BPSG film, $Si_3N_4$ film, etc. FIG. 1 illustratively shows the insulating film layers 8a, 8b deposited on the gate electrodes 7a, 7b as interlayer insulating films, but the insulating films existing below the barrier metal of the present invention are not limited to being only interlayer insulating films. The insulating films existing below the barrier metal of the present invention may be field oxide films used for LOCOS isolation or STI isolation or oxide films connecting therewith, etc. In some cases, the insulating films existing below the barrier metal of the present invention can include a gate insulating film thinner than the interlayer insulating film or field oxide film or a thin insulating film connecting therewith, etc. Although not shown in FIG. 1, the top part of the active region (1, 2, 3, 4a to 4d, 5a to 5c) may contain an isolation region such as an STI structure. In other words, the isolation region may be contained in the periphery of the structure shown in FIG. 1 so as to define the active region (1, 2, 3, 4a to 4d, 5a to 5c). Furthermore, a structure such as guard rings via various types of insulators for realizing a voltage-withstand structure may be contained in the periphery of the structure shown in FIG. 1. For example, the thickness of the insulating film layers 8a, 8b as interlayer insulating films is around 0.4 μm to 1.5 μm, but a composite film in which a thinner insulating film or the like is contained in a lower layer may be used.

In the semiconductor device according to the embodiment of the present invention, the Ni silicide used as the base contact layers 11a to 11c is filled into the semiconductor layer side of the active region (1, 2, 3, 4a to 4d, 5a to 5c), and formed so as to overlap with the lower side of the first barrier film 9. The second and third barrier films 12, 13 are formed on the upper surface of the base contact layers 11a to 11c and the first barrier film 9 and can thus be planarized.

Furthermore, the first to third barrier films 9, 12, 13 are provided between the insulating film layers 8a, 8b, and surface electrode layer 14. The second and third barrier films 12, 13 are provided between the base contact layers 11a to 11c and the surface electrode layer 14, and the third barrier film 13 contains titanium oxide and TiN. Accordingly, it is possible to improve barrier characteristics for preventing the diffusion of hydrogen atoms and metal atoms such as Al. contained in the surface electrode layer 14, and thus it is possible to suppress fluctuations in the electrical characteristics of the semiconductor device.

(Method of Manufacturing Semiconductor Device)

Figure 2:
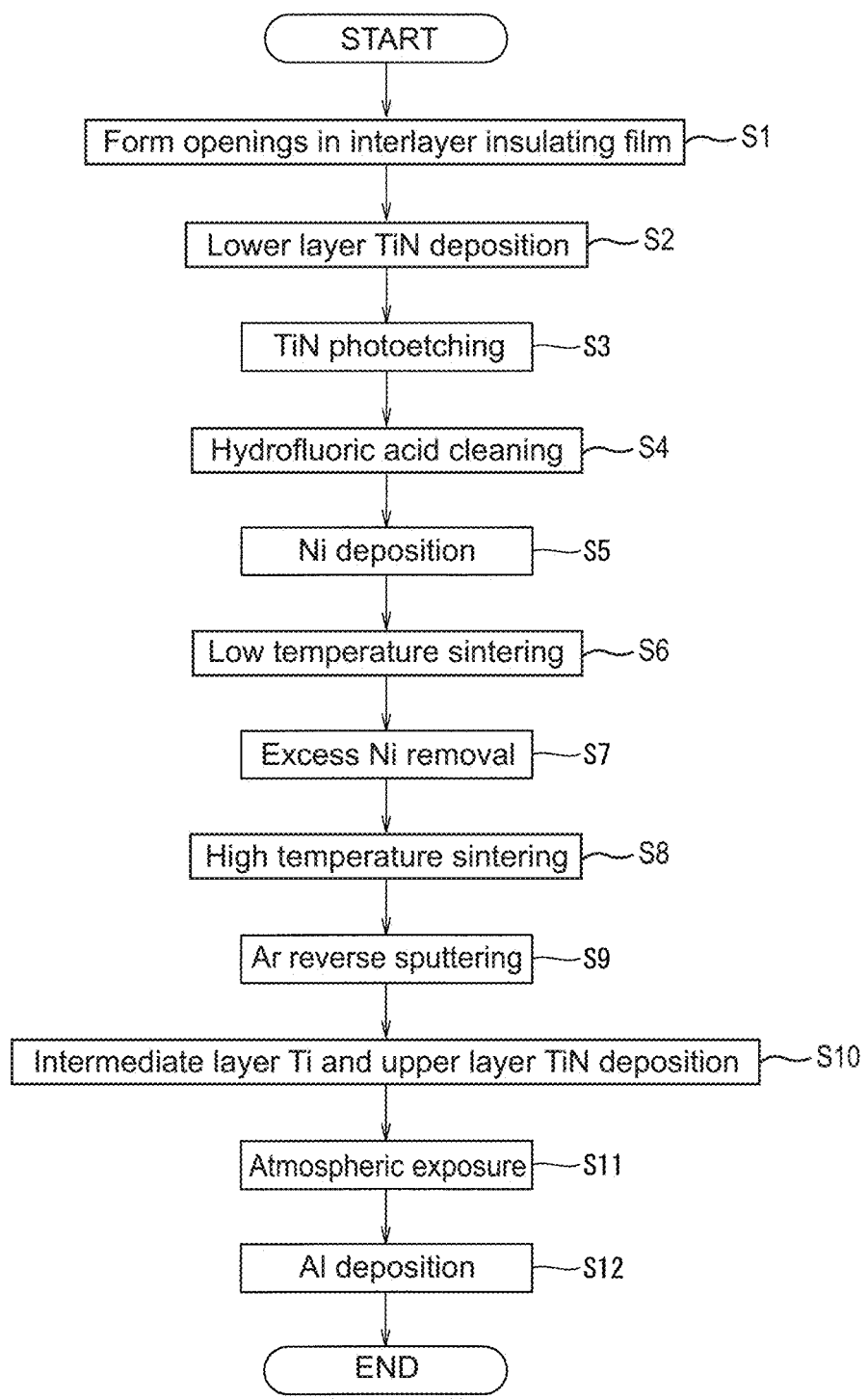
FIG. 2 is a flowchart showing one example of a method of manufacturing the semiconductor device according to the embodiment of the present invention.

Next, following the flowchart shown in FIG. 2, the cross-sectional view of the steps shown in FIGS. 3 to 11 will be used to describe a method of manufacturing the semiconductor device according to the embodiment of the present invention in an example with a trench gate MISFET. The method of manufacturing the trench gate MISFET described below is one example, and various other types of methods of manufacturing can be performed, including the modification examples of this example, within the scope set forth in the claims.

Figure 3:
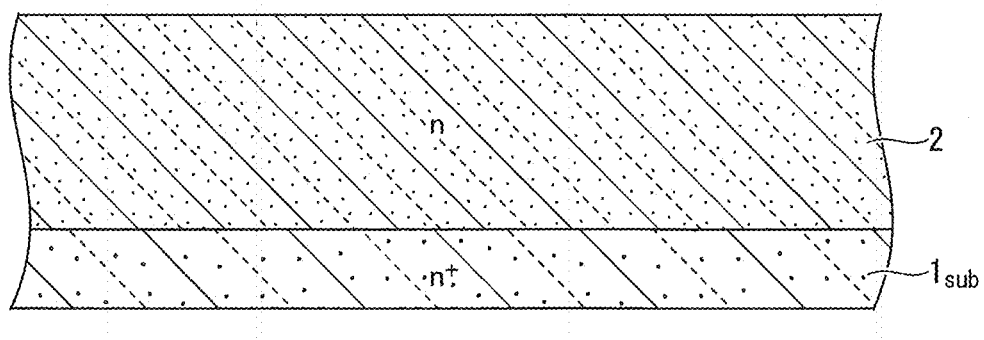
FIG. 3 is a cross-sectional view of a step for describing one example of the method of manufacturing the semiconductor device according to the embodiment of the present invention.
Figure 4:
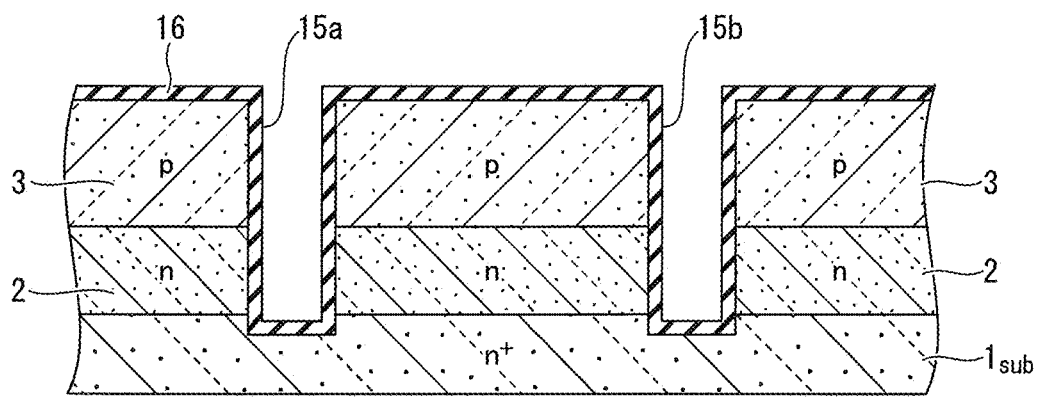
FIG. 4 is a cross-sectional view of a step after the step shown in FIG. 3 for describing one example of the method of manufacturing the semiconductor device according to the embodiment of the present invention.
Figure 5:
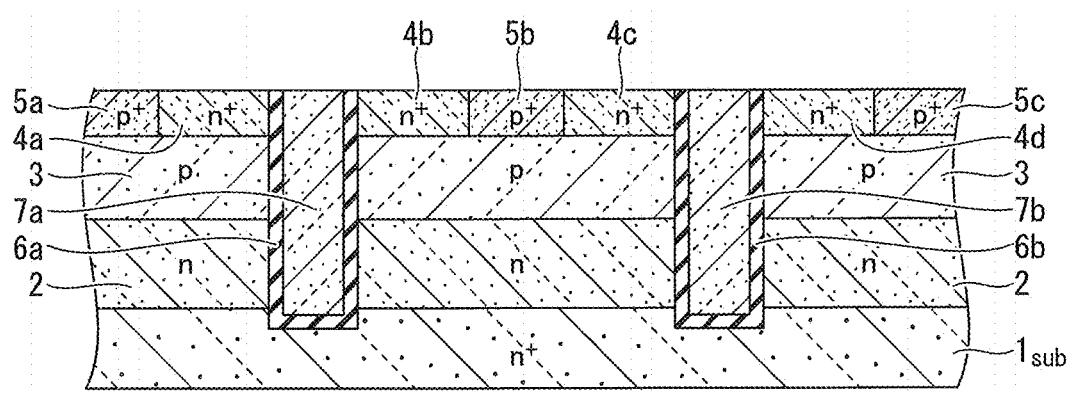
FIG. 5 is a cross-sectional view of a step after the step shown in FIG. 4 for describing one example of the method of manufacturing the semiconductor device according to the embodiment of the present invention.

First, as shown in FIG. 3, an n+ substrate (SiC substrate) $I_{sub}$ to which an n-type impurity such as nitrogen (N) has been added is prepared. The n-type drift layer 2 is epitaxially grown on the upper surface of the substrate $I_{sub}$. As shown in FIG. 4, ion implantation or epitaxial growth etc. is used on the upper surface of the drift layer 2 to form the base region 3 to obtain the fundamental structure of the carrier traveling regions (2, 3). Next, photolithography, ion implantation, a heat treatment, etc. are used to selectively form ohmic contact formation regions made of n+ source regions 4a to 4d and p+ base contact regions 5a to 5c on an upper part of the base region 3. The diffusion coefficient of the impurities inside SiC is small, and thus the ion implantation may be multi-stage ion implantation that is carried out a plurality of rounds while changing acceleration voltages, or the ohmic contact formation regions may be formed by impurity diffusion etc. associated with optical excitation such as by laser light. Thereafter, dry etching such as photolithography and reactive ion etching (RIE) is used to selectively form a plurality of trenches including trenches 15a, 15b going through the base region 3 and drift layer 2 and reaching the upper part of the substrate $I_{sub}$. After this, a thermal oxidation method or the like is used to form an insulating film 16 such as an $SiO_2$ film on the bottom surface and side surfaces of each of the plurality of trenches including the trenches 15a, 15b, and the upper surface of the base regions 3. As shown in FIG. 5, chemical vapor deposition (CVD) and etching etc. are used to fill the inside of each of the plurality of trenches including the trenches 15a, 15b with polysilicon and to form the gate electrodes 7a, 7b, and the gate insulating films 6a, 6b.

Figure 6:
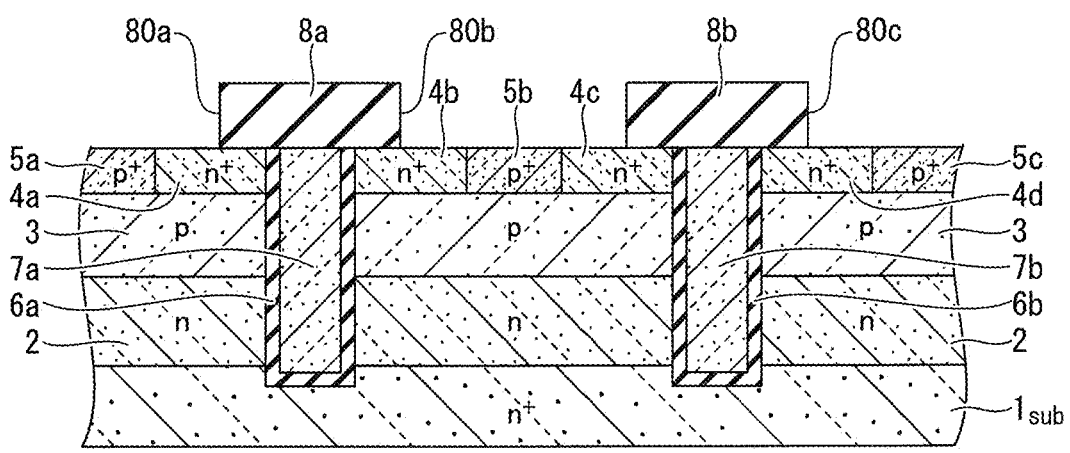
FIG. 6 is a cross-sectional view of a step after the step shown in FIG. 5 for describing one example of the method of manufacturing the semiconductor device according to the embodiment of the present invention.

In step S1 shown in FIG. 2, CVD or the like is used to deposit an insulating film such as a composite film of NSG and BPSG on the upper surfaces of the gate insulating films 6a, 6b, gate electrodes 7a, 7b, source regions 4a to 4d, and base contact regions 5a to 5c. Photolithography and dry etching etc. are used to selectively form the insulating film layers 8a, 8b as interlayer insulating films on the gate insulating films 6a, 6b and gate electrodes 7a, 7b. As shown in FIG. 6, window parts of the insulating film layers 8a, 8b in which the insulating film layers 8a, 8b are not present are provided. In those window parts provided in the interlayer insulating film, the base contact regions 5a to 5d and a portion of the source regions 4a to 4d are exposed.

Figure 7:
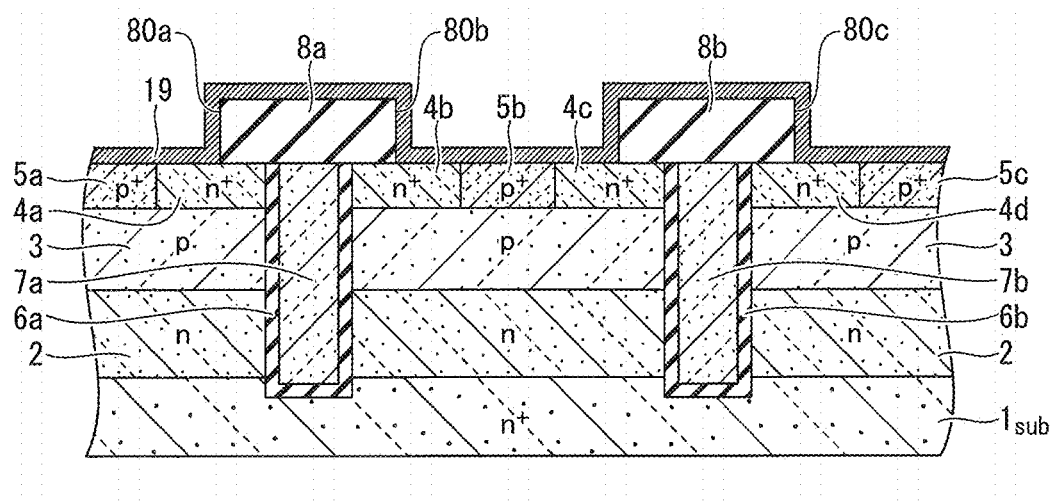
FIG. 7 is a cross-sectional view of a step after the step shown in FIG. 6 for describing one example of the method of manufacturing the semiconductor device according to the embodiment of the present invention.

In step S2, sputtering or low pressure (LP) CVD etc. is used to deposit a lower layer TiN film 19 on the entire upper surface of the insulating film layers 8a, 8b and the window parts of the insulating film layers 8a, 8b at a thickness of 10 nm to 150 nm. The lower layer TiN film 19 is preferably 50 nm to 150 nm. As shown in FIG. 7, the lower layer TiN film 19 covers the surfaces of the ohmic contact formation regions exposed at the window parts so as to include the insulating film layers 8a, 8b.

Figure 8:
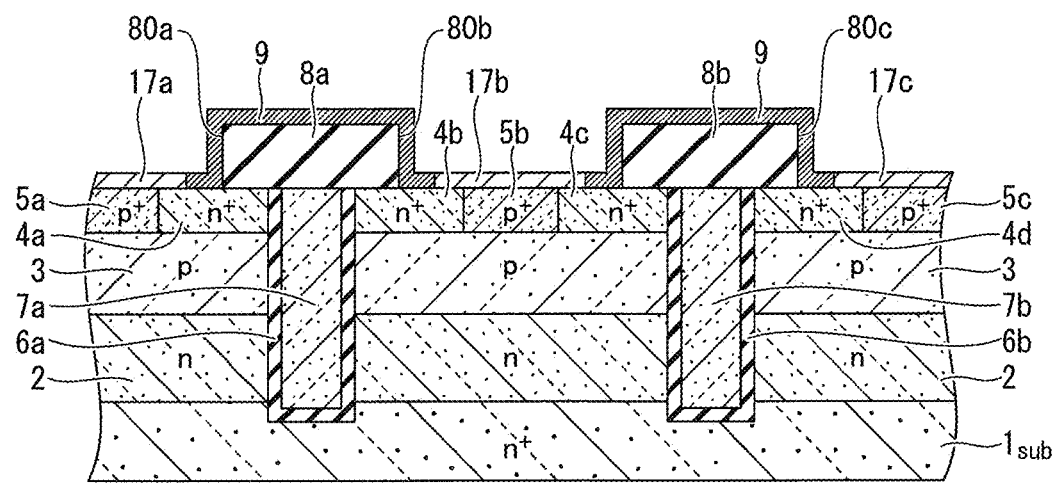
FIG. 8 is a cross-sectional view of a step after the step shown in FIG. 7 for describing one example of the method of manufacturing the semiconductor device according to the embodiment of the present invention.

In step S3, via photolithography and dry etching etc., a selection mask is used to selectively remove the lower layer TiN film 19 and pattern the first barrier film 9. As shown in FIG. 8, in a portion inside the window parts of the insulating film layers 8a, 8b, ohmic opening parts exposing the ohmic contact formation regions are formed in the first barrier film 9. In other words, the ohmic opening parts expose the base contact regions 5a to 5c and a portion of the source regions 4a to 4d as a portion of the ohmic contact formation regions. After the selection mask is removed, in step S4, hydrofluoric acid or the like is used to clean the surface of the exposed ohmic opening parts. Next, in step S5, sputtering or vacuum deposition etc. is used to deposit Ni films 17a, 17b, and 17c to fill in the ohmic opening parts. As shown in FIG. 8, the Ni films 17a, 17b, 17c are provided adjacent to each other such that the distal ends contact the first barrier film 9. The patterning of the Ni films 17a, 17b, 17c may use a lift-off method.

Figure 9:
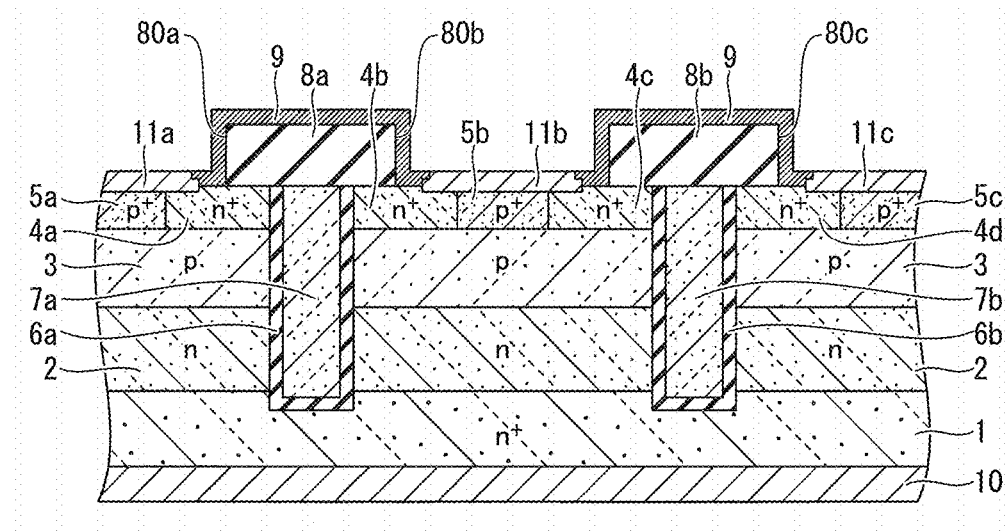
FIG. 9 is a cross-sectional view of a step after the step shown in FIG. 8 for describing one example of the method of manufacturing the semiconductor device according to the embodiment of the present invention.

In step S6, the Ni films 17a, 17b, 17c are heat-treated at a low temperature (first temperature) in a range of 300° C. to 700° C. (preferably 300° C. to 500° C.), and a portion of the Ni films 17a, 17b, 17c are changed to Ni silicide. In step S7, wet etching etc. is used to remove excess Ni unreacted in the heat treatment. In step S8, the Ni silicide produced by the low temperature heat treatment is heat-treated at a high temperature (second temperature) in a range of 800° C. to 1000° C. (preferably 800° C. to 900° C.). As a result, base contact layers 11a to 11c made of Ni silicide are formed. The two-staged heat treatment with the first temperature and second temperature positions the lower end (lower surface) of the Ni silicide to below the main surface of the ohmic contact formation regions. Furthermore, the Ni silicide is formed to eat into the lower side of the first barrier film 9 at a position where the first barrier film 9 and the base contact layers 11a to 11c contact each other. Next, chemical mechanical polishing (CMP) etc. is used to polish and adjust the thickness of the lower surface of the substrate $1_{sub}$ and form the drain region 1. Thereafter, as shown in FIG. 9, sputtering or vacuum deposition etc. is used to form a rear surface electrode layer (drain electrode layer) 10 made of Au etc. on the lower surface of the drain region 1.

Figure 10:
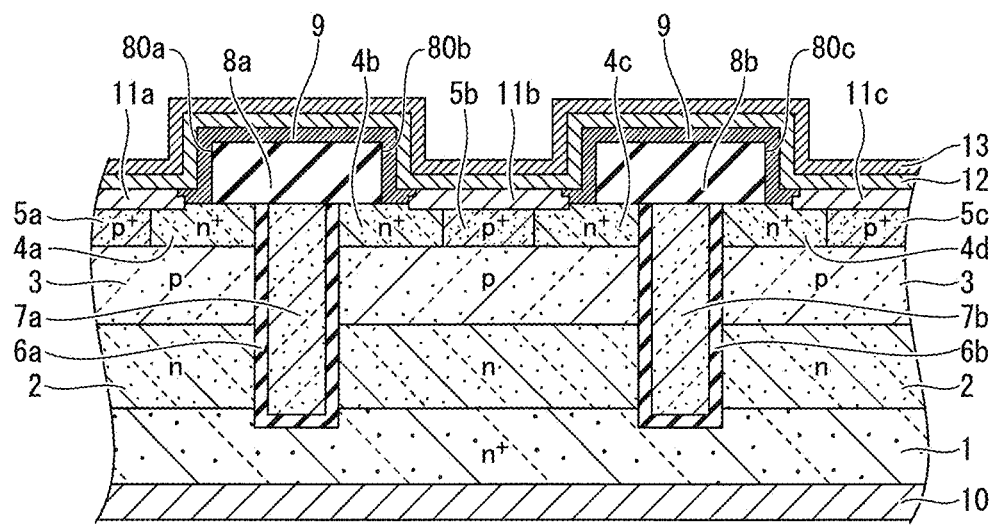
FIG. 10 is a cross-sectional view of a step after the step shown in FIG. 9 for describing one example of the method of manufacturing the semiconductor device according to the embodiment of the present invention.

In step S9, argon (Ar) reverse sputtering etc. is used to remove natural oxide films and dirt such as carbon (C) remaining on the surface of the first barrier film 9 and base contact layers 11a to 11c. Thereafter, in step S10, as shown in FIG. 10, sputtering etc. is used to continually deposit an intermediate Ti film (second barrier film) 12 and upper layer TiN film (third barrier film) 13 on the entire surface. The thickness of the second barrier film 12 is 10 nm to 50 nm, and the thickness of the third barrier film 12 is 10 nm to 150 nm (preferably 50 nm to 150 nm).

In step S11, the surface of the third barrier film 13 formed on the uppermost surface is exposed to the atmosphere, and the surface of the TiN film forming the third barrier film 13 is caused to react with oxygen. By reacting with oxygen in the atmosphere, titanium oxide ($TiO_x$) is formed on at least a portion of the surface of the TiN film. After atmospheric exposure, in step S12, sputtering or vacuum deposition etc. is used to deposit a metal film such as Al to form the surface electrode layer 14. This completes the semiconductor device according to the embodiment of the present invention. An order may be used in which the step of forming the drain region 1 by polishing the lower surface of the substrate $1_{sub}$ is performed after the step of forming the surface electrode layer 14, and thereafter the rear surface electrode layer 10 made of Au etc. is formed on the lower surface of the drain region 1. Furthermore, the reaction between the surface of the TiN film and oxygen in step S11 is not limited to a method of being exposed to the atmosphere. Various types of methods are possible, such as diluting a high purity oxygen gas with a high purity inert gas and causing the diluted gas to flow at a predetermined flow rate on the surface of a TiN film placed in a reaction chamber, for example.

Figure 11:
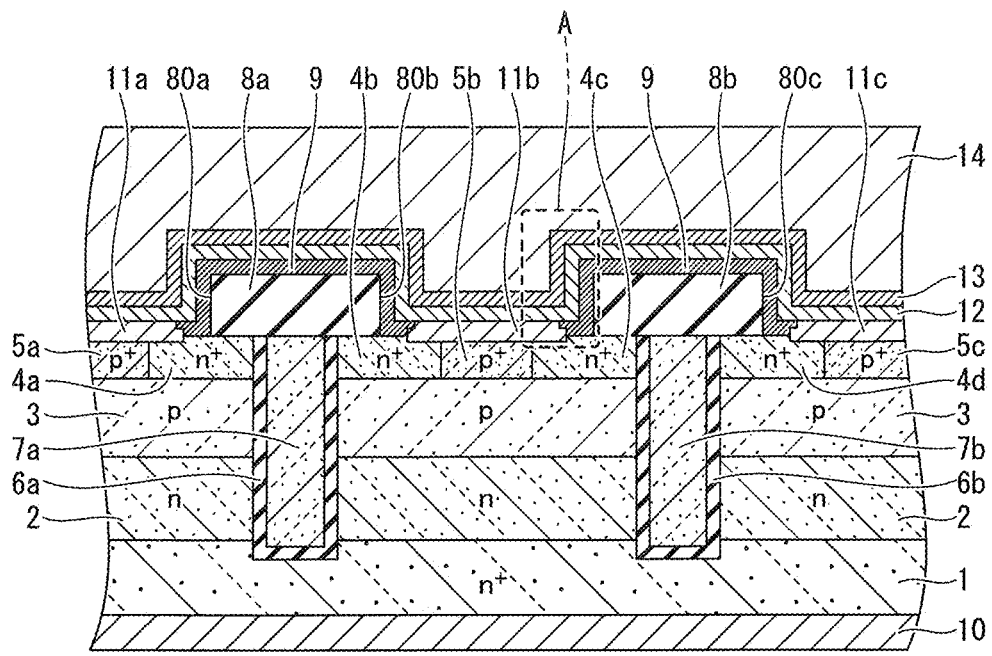
FIG. 11 is a cross-sectional view of a step after the step shown in FIG. 11 for describing one example of the method of manufacturing the semiconductor device according to the embodiment of the present invention.
Figure 12:
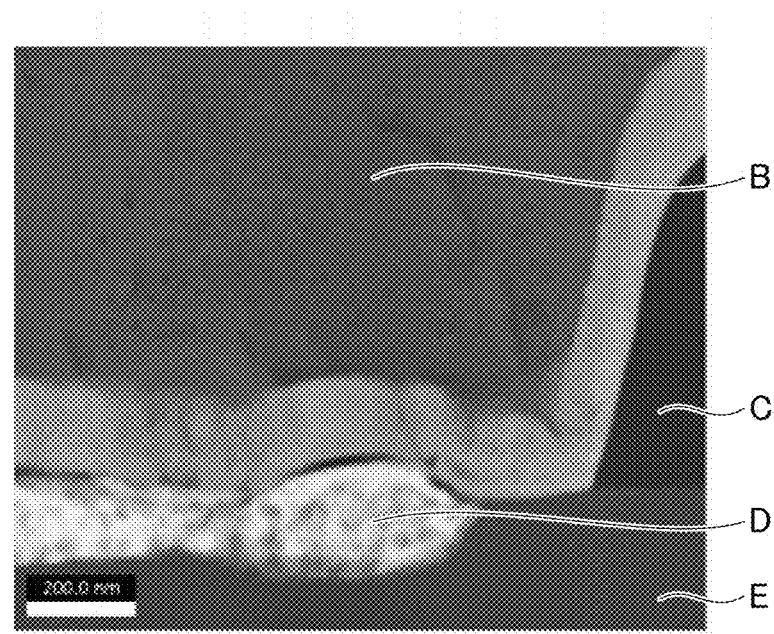
FIG. 12 is a TEM image of a cross-sectional part A shown in FIG. 11.

FIG. 12 shows a transmission electron microscopy (TEM) image of a cross-sectional part A shown in FIG. 11. In FIG. 12, "B" is the Al film of the surface electrode 14, "C" is the BPSG film of the insulating film layer 8b, "D" is the Ni silicide film of the base contact layers 11b, and "E" is the semiconductor layer of the source regions 4c. As shown in FIG. 12, the lower end (lower surface) of the Ni silicide film is positioned below the surface of the semiconductor layer, and the Ni silicide film is formed so as to overlap the bottom side of the first barrier film 9. Accordingly, it is possible to improve planarization of the base contact layers 11a to 11c.

Figure 13:
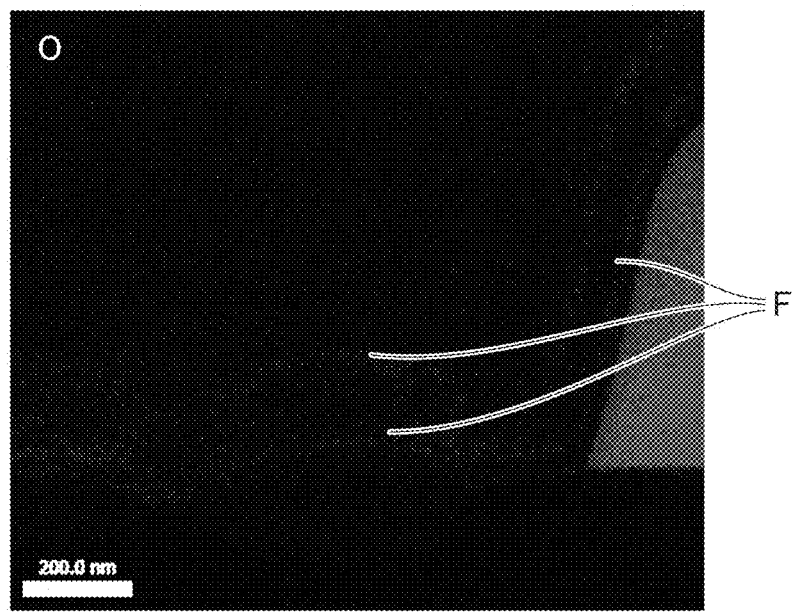
FIG. 13 is an EDX image showing oxygen distribution of the cross-sectional part A shown in FIG. 11.
Figure 14:
FIG. 14 is an EDX image showing titanium distribution of the cross-sectional part A shown in FIG. 11.
Figure 15:
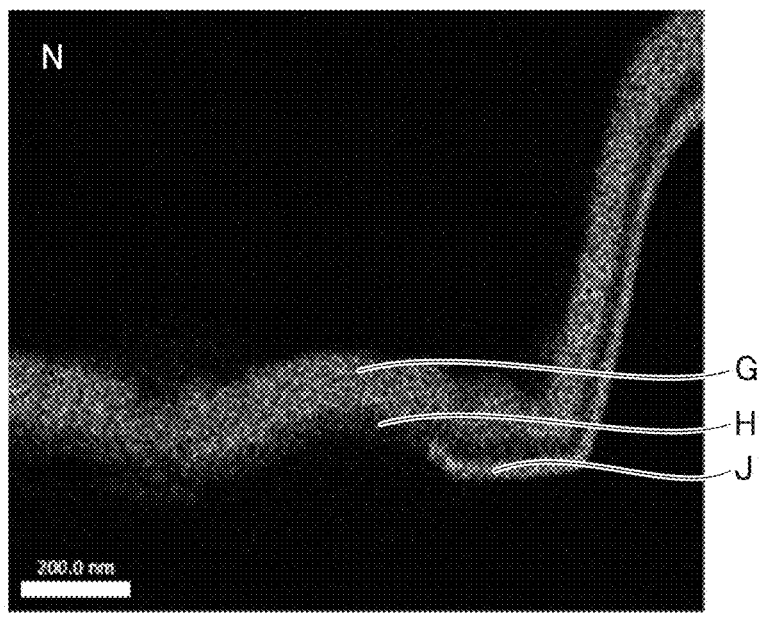
FIG. 15 is an EDX image showing nitrogen distribution of the cross-sectional part A shown in FIG. 11.
Figure 16:
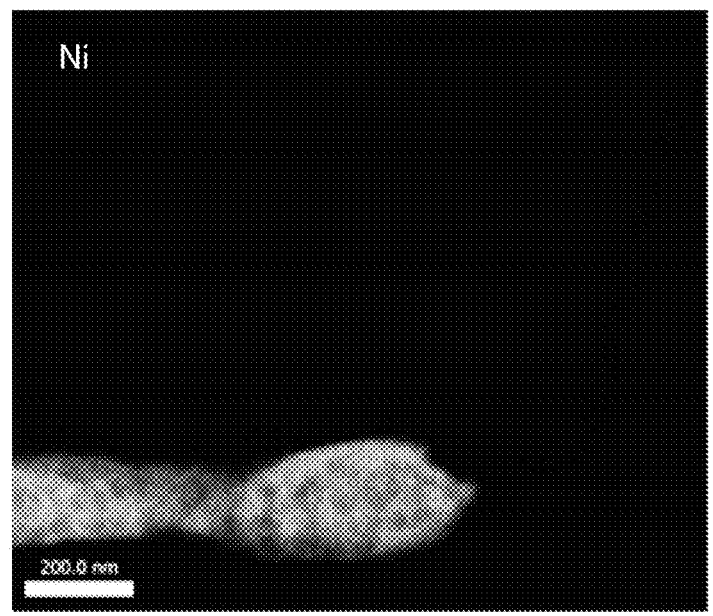
FIG. 16 is an EDX image showing nickel distribution of the cross-sectional part A shown in FIG. 11.

Moreover, FIGS. 13 to 16 show the results of analysis by TEM/energy-dispersive X-ray spectroscopy method (EDX). Distribution images of O, Ti, N, and Ni are shown. FIG. 13 is an O distribution image, from which it can be understood that a large amount of O is distributed in the surface of the upper side TiN film (third barrier film 13) shown by "F," the surface of the lower side TiN film (first barrier film 9), and the surface of the Ni silicide film of the base contact layers 11a to 11c. FIG. 14 is a Ti distribution image, from which the Ti distribution in the first to third barrier films 9, 12, 13 can be seen. FIG. 15 is an N distribution image, from which the N distribution in the third barrier film shown 13 shown by "G" and the first barrier film 9 shown by "J" can be seen, and from which it can be understood that N is not distributed in the second barrier film 12 shown by "H." FIG. 16 is a Ni distribution image, from which the Ni distribution in the base contact layers 11a to 11c can be seen. In this manner, it can be understood that the first barrier film 9 is formed so as to include the BPSG film of the interlayer film layers 8a, 8b. Furthermore, it can be understood that the second barrier film 12 and the third barrier film 13 are formed so as to separate the Al film of the surface electrode layer 14 and the BPSG film and semiconductor layer. Accordingly, the first to third barrier films 9, 12, 13 make it possible to suppress diffusion of Al and $H_2$ etc. from the surface electrode layer 14.

As shown in FIG. 13, the reason that O is distributed in the surface of the upper side TiN film, lower side TiN film, and Ni silicide film is because all have been exposed to the atmosphere. O distribution is small for the Ti film surface of the second barrier film 12, which has no atmospheric exposure. In particular, in the third barrier film 13 contacting the Al layer of the surface electrode layer 14, O diffuses into the grain boundaries of the TiN film and reacts with the remaining Ti to produce $TiO_x$. In this manner, the produced $TiO_x$ reduces the spaces between the grain boundaries of the TiN film, and thus the third barrier film 13 can increase the function for suppressing the diffusion of Al and $H_2$ etc. from the surface electrode layer 14. Thus, according to the embodiment of the present invention, the $TiO_x$ produced in the surface of the third barrier film 13 reduces the spaces between the grain boundaries of the TiN film, and therefore there is an improvement in the barrier characteristics of the three-layer structure made of the first barrier film 9, second barrier film 12, and the third barrier film 13. Accordingly, the embodiment of the present invention suppresses fluctuations in electric boundary conditions, thereby making it possible to provide a semiconductor device with stable electrical characteristics and high reliability.

In the case where a silicide film is used for the base contact layers 11a to 11c, the "substrate $I_{sub}$" shown in FIG. 3 can be a semiconductor wafer containing Si, such as silicon (Si) or silicon carbide (SiC). The substrate $I_{sub}$ shown in FIG. 3 functions as the drain region 1 of the MOS transistor in FIG. 1, but this is merely an example. In the present invention, as long as the structure of the active region (1, 2, 3, 4a to 4d, 5a to 5c) is made of a semiconductor material containing Si, it is not necessary for the substrate $I_{sub}$ to be a semiconductor wafer etc. containing Si. For example, the structure in which an active layer (2, 3, 4a to 4d, 5a to 5c) made of a semiconductor material containing Si is formed on the substrate $I_{sub}$ via a heterostructure may be adopted. In particular, as long as the ohmic contact formation region (4a to 4d, 5a to 5c) is configured to be made of a semiconductor material containing Si, it is not necessary for the substrate $I_{sub}$ to be a semiconductor wafer etc. containing Si. Furthermore, when the silicide film is not used for the base contact layers 11a to 11c, the substrate $I_{sub}$ is not limited to a semiconductor containing Si. In particular, if the semiconductor device does not have the substrate $I_{sub}$ functioning as the main electrode region such as the drain region 1, then it is not necessary for the substrate $I_{sub}$ to be a semiconductor. In other words, depending on the structure of the semiconductor device, the substrate $I_{sub}$ may be an insulating substrate or other materials. Moreover, it may be possible that the substrate $I_{sub}$ is Si and the structure of the active layer (2, 3, 4a to 4d, 5a to 5c) on the substrate $I_{sub}$ is formed of a region made of semiconductor containing Si other than pure Si.

In addition, the substrate 1 is not limited to a base material obtained by cutting into wafer shapes an ingot raised by the Czochralski method (CZ method) or floating zone method (FZ method) etc. In addition to a raw substrate as the base material, the substrate 1 encompasses an epitaxial growth substrate epitaxially grown on the upper surface of the raw substrate, a laminate structure such as an SOI substrate in which an insulating film contacts the lower surface of the raw substrate, etc. In other words, the substrate 1 is a collective term for a broad concept that includes, in addition to the raw substrate, various types of laminate structures, an active region using a portion of such a laminate structure, and the like.

Other Embodiments

As described above, an embodiment of the present invention was disclosed, but the description and drawings forming a portion of this disclosure shall not be construed as limiting the present invention. Various substitute embodiments, examples, and applied techniques should be clear to a person skilled in the art based on this disclosure.

For example, a MOS transistor, which is an individual semiconductor element, was illustratively described in the embodiment above, but a semiconductor device serving as the target for application of the present invention is not limited to an individual semiconductor element. The semiconductor device of the present invention may be a semiconductor integrated circuit (IC) such as a DRAM or flash memory, an image sensor, or the like, or may be a power IC, for example. In the case of a semiconductor integrated circuit, the contact holes formed in the insulating film layers 8a, 8b can be so-called "via holes" with a high aspect ratio. In other words, in order to expose the ohmic contact formation region (4a to 4d, 5a to 5d), the via holes may be formed in the insulating film layers 8a, 8b, and the present invention may be applied to a via plug structure. Furthermore, in the case of a semiconductor integrated circuit or the like, the surface electrode layer 14 shown in FIG. 1 can exist as a surface wiring layer.

Thus, it goes without saying that the present invention includes various embodiments etc. not disclosed here, such as configurations in which various configurations described in the embodiment and respective modification examples above are applied as desired. Accordingly, the technical scope of the present invention is determined solely by the invention-defining matters within a reasonable scope of the claims from the descriptions above.

It will be apparent to those skilled in the art that various modifications and variations can be made in the present invention without departing from the spirit or scope of the invention. Thus, it is intended that the present invention cover modifications and variations that come within the scope of the appended claims and their equivalents. In particular, it is explicitly contemplated that any part or whole of any two or more of the embodiments and their modifications described above can be combined and regarded within the scope of the present invention.

What is claimed is:

1. A semiconductor device, comprising:
   an active region made of semiconductor containing silicon, the active region including a carrier traveling region and an ohmic contact formation region having a higher impurity concentration than the carrier traveling region;
   an insulating film layer selectively disposed on a main surface of the active region, the insulting film layer having a window that exposes a portion of the ohmic contact formation region;
   a first barrier film, made of an electrically conductive material, covering, and being directly in contact with, the main surface of the active region and the insulating film layer, the first barrier film having an ohmic contact hole that exposes a contact portion of the ohmic contact formation region within the window of the insulating film layer;
   a base contact layer filled into the ohmic contact hole and making ohmic contact with said contact portion of the ohmic contact formation region;
   a second barrier film made of titanium, covering, and being directly in contact with, the base contact layer and the first barrier film;
   a third barrier film made of titanium oxide and titanium nitride, covering, and being directly in contact with, a surface of the second barrier film; and
   a surface electrode layer disposed on the third barrier film.

2. The semiconductor device according to claim 1, wherein the base contact layer comprises nickel silicide.

3. The semiconductor device according to claim 1, wherein the base contact layer is partially embedded in the main surface of the active region.

4. The semiconductor device according to claim 1, wherein the ohmic contact formation region includes a first conductivity type semiconductor region and a second conductivity type semiconductor region adjacent to the first conductivity type semiconductor region.

5. The semiconductor device according to claim 1, wherein the ohmic contact formation region comprises a main electrode region that emits or receives a main current that flows through the carrier traveling region.

6. The semiconductor device according to claim 5, wherein the ohmic contact formation region further comprises a base contact region that is in contact with a base region that forms a channel as a portion of the carrier traveling region.

7. The semiconductor device according to claim 1, wherein the first barrier film is made of titanium nitride.

8. The semiconductor device according to claim 1,
wherein the base contact layer is made of nickel silicide,
wherein the first barrier film is made of titanium nitride,
wherein a thickness of the first barrier film is 10 nm to 150 nm,
wherein a thickness of the second barrier film is 10 nm to 100 nm, and
wherein a thickness of the third barrier film is 10 nm to 150 nm.

9. A method of manufacturing a semiconductor device, the method comprising:
forming, in an active region made of semiconductor containing silicon, a carrier traveling region and an ohmic contact formation region having a higher impurity concentration than the carrier traveling region;
forming an insulating film layer on a main surface of the active region, the insulting film layer having a window that exposes a portion of the ohmic contact formation region;
forming a first barrier film, made of an electrically conductive material, covering, and being directly in contact with, the main surface of the active region and the insulating film layer, the first barrier film having an ohmic contact hole that exposes a contact portion of the ohmic contact formation region within the window of the insulating film layer;
filling a base contact layer into the ohmic contact hole so as to make ohmic contact with said contact portion of the ohmic contact formation region;
forming a second barrier film by depositing a titanium layer covering, and being directly in contact with, the base contact layer and the first barrier film;
forming a titanium nitride film covering, and being directly in contact with, the second barrier film;
causing the titanium nitride film to react with oxygen so as to contain titanium oxide in a portion of the titanium nitride film, thereby forming a third barrier film made of titanium oxide and titanium nitride covering, and being directly in contact with, the second barrier film; and
forming a surface electrode layer on the third barrier film.

10. The method of manufacturing the semiconductor device according to claim 9, wherein the forming the base contact layer comprises:
depositing nickel on the ohmic contact formation region exposed by the ohmic contact hole;
changing a portion of the nickel to nickel silicide by performing a heat treatment on the nickel at a first temperature;
removing unreacted nickel after the heat treatment of the first temperature; and
heat-treating the nickel silicide at a second temperature higher than the first temperature.

11. The method according to claim 9, wherein the first barrier film is made of titanium nitride.

12. The method according to claim 9,
wherein the base contact layer is made of nickel silicide,
wherein the first barrier film is made of titanium nitride,
wherein a thickness of the first barrier film is 10 nm to 150 nm,
wherein a thickness of the second barrier film is 10 nm to 100 nm, and
wherein a thickness of the third barrier film is 10 nm to 150 nm.

* * * * *